United States Patent [19]
Grebliunas et al.

[11] Patent Number: 5,523,716
[45] Date of Patent: Jun. 4, 1996

[54] MICROWAVE PREDISTORTION LINEARIZER

[75] Inventors: John R. Grebliunas, Manhattan Beach; Arnold L. Berman, Los Angeles; David L. Crampton, Long Beach, all of Calif.

[73] Assignee: Hughes Aircraft Company, Los Angeles, Calif.

[21] Appl. No.: 322,255

[22] Filed: Oct. 13, 1994

[51] Int. Cl.⁶ ........................................ H03F 1/26
[52] U.S. Cl. .................... 330/149; 330/307; 333/104
[58] Field of Search ............................ 330/149, 307; 333/20, 104, 262

[56] References Cited

U.S. PATENT DOCUMENTS

| | | | |
|---|---|---|---|
| 2,999,986 | 9/1961 | Holbrook | 330/149 |
| 4,255,724 | 3/1981 | Bergero | 330/149 X |
| 4,902,983 | 2/1990 | Fujiki et al. | 330/149 |
| 5,038,113 | 8/1991 | Katz et al. | 330/277 |
| 5,138,275 | 8/1992 | Abbiati et al. | 330/149 |

FOREIGN PATENT DOCUMENTS

| | | | |
|---|---|---|---|
| 2455395 | 12/1980 | France | 330/149 |
| 179606 | 8/1986 | Japan | 330/149 |

*Primary Examiner*—James B. Mullins
*Attorney, Agent, or Firm*—Terje Gudmestad; W. K. Denson-Low

[57] ABSTRACT

A predistortion linearizer (10) and method for distorting an AC input signal (42) to a power amplifier (24) provide a distortion to the input signal which is complementary to a distortion, in terms of gain and phase, introduced by the power amplifier as a function of signal amplitude, thereby to linearize the power amplifier. The linearizer includes a switching circuit (26, $Z_1$ 28, $Z_2$) having an input terminal (16) and an output terminal (20) and a pair of antiparallel diodes (26, 28) connected between the input terminal and the output terminal of the switching circuit. The linearizer has also an impedance circuit ($Z_3$) comprising solely passive electrical elements connected between the input terminal and the output terminal of the switching circuit, wherein elements of the impedance circuit have values selected to introduce the complementary distortion to the input signal as a function of amplitude of the input signal to linearize the power amplifier.

14 Claims, 2 Drawing Sheets

PREDISTORTION LINEARIZER,10

PREDISTORTION LINEARIZER,10

NONLINEAR SECTION,12

MICROWAVE PREDISTORTION LINEARIZER

BACKGROUND OF THE INVENTION

This invention relates to a predistortion linearizer circuit suitable for applying a signal to a power amplifier for linearizing a signal outputted by the amplifier and, more particularly, to a linearizing circuit having a reduced number of components and reduced physical size advantageous for satellite communication systems.

High power amplifiers are employed in numerous situations including satellite communication systems wherein a high power amplifier, such as a solid state power amplifier or a traveling wave tube amplifier, is employed to amplify a signal to a sufficient power level for transmission from the satellite to a ground station. A disadvantageous characteristic of the high power amplifiers is a changing gain as a function of input signal level and a changing phase shift as a function of input signal level. As a result, the requisite high power is obtained at the price of introduction of amplitude and phase nonlinearities to the signals transmitted via a satellite communication link. Thus, there is distortion in the information carrying RF (radio frequency) signal.

To counteract the distortion introduced by the power amplifier, it has been the practice to employ a predistortion linearizer circuit in the signal path before the amplifier to introduce a distortion to the signal, in the form of both an amplitude and a phase nonlinearity, which is the inverse of the amplifier distortion, thereby to cancel the amplifier distortion and provide a linear output signal. Most predistortion linearizer circuits described in the microwave circuit literature make use of power combing hybrids in conjunction with nonlinear circuits to realize either a reflective or transmission predistortion linearizer. These circuits are typically rather large due to their complexity. Some circuits are more compact and employ an .active elements such as a gallium-arsenide field-effect transistor (GaAs FET) in a common-gate or common-source configuration. Examples of such a circuit are provided in U.S. Pat. Nos. 5,038,113 (General Electric) and 5,138,275 (Siemens).

A problem arises in that the foregoing predistortion linearizer circuits are more complex and costly than is desired, and may not allow for independent control of amplitude and phase nonlinearities. The complexity is due in part to the need for a bias circuit to supply the requisite operating bias current and voltage to the transistor, and to the use of relatively complex additional circuitry to develop the desired nonlinearities.

SUMMARY OF THE INVENTION

The aforementioned problem is overcome and other advantages are provided by a predistortion linearizer circuit for linearizing simultaneously the amplitude and the phase characteristics of a power amplifier by introducing a selectable amplitude and a selectable phase characteristic which are complementary to the amplitude and the phase characteristics of the power amplifier, thereby to cancel the nonlinearities in signal amplification by the power amplifier. In accordance with the invention, the predistortion linearizer has a forward diode branch and a reverse diode branch and a third branch, wherein the three branches are connected in parallel, and individual ones of the branches may be provided with respective impedance components, all of the components being passive electrical elements. The invention provides that, by adjustment of the input and output signal values of the linearizer, and by adjustment of the impedance components, the linearizer provides the requisite complementary set of amplitude and phase characteristics for linearizing the power amplifier.

BRIEF DESCRIPTION OF THE DRAWING

The aforementioned aspects and other features of the invention are explained in the following description, taken in connection with the accompanying drawing wherein.

Identically labeled elements appearing in different ones of the figures refer to the same element in the different figures.

DETAILED DESCRIPTION

Figure 1:
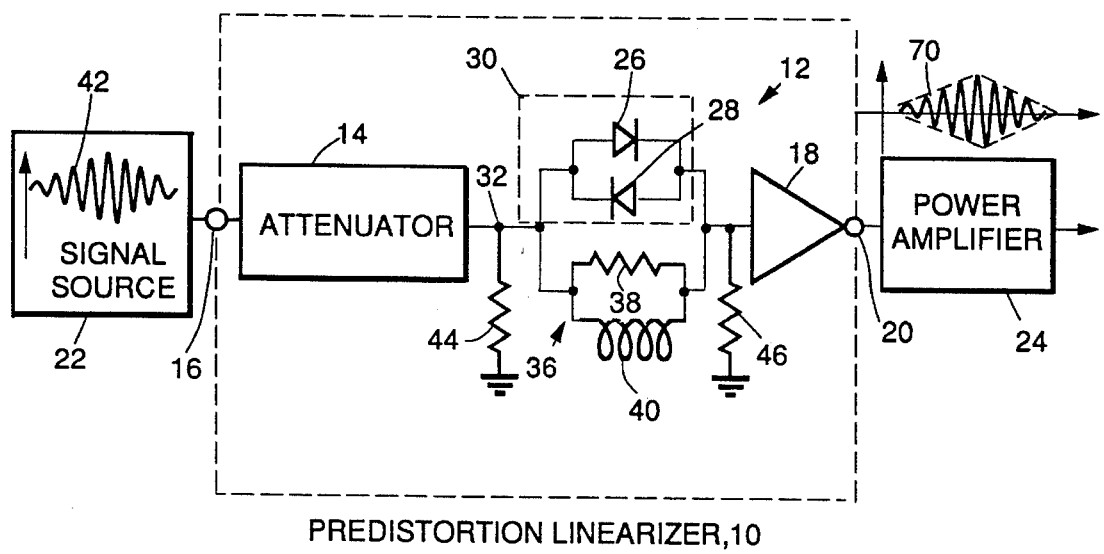
FIG. 1 is a schematic diagram of an electrical circuit of a predistortion linearizer in accordance with the invention.

With reference to FIG. 1, a predistortion linearizer 10 is constructed in accordance with the invention and includes a nonlinear section 12 which is connected by an attenuator 14 to an input terminal 16 of the linearizer 10, and which is connected by an adjustable gain amplifier 18 to an output terminal 20 of the linearizer 10. The linearizer 10 is connected between a source 22 of a microwave signal, or other AC (alternating current) signal, and a power amplifier 24 which may be a traveling wave tube (TWT) or solid state power amplifier (SSPA). The source 22 applies an input signal, typically in a range 2–18 GHz (gigahertz) to the input terminal 16 to be processed by the linearizer 10, and the processed signal is applied by the linearizer 10, via the output terminal 20, to the power amplifier 24.

In accordance with a feature of the invention, the nonlinear section 12 is composed solely of passive electronic components, and includes a pair of antiparallel diodes 26 and 28 serving as a switching unit 30 connected between circuit nodes 32 and 34. Also included in the nonlinear section 12 is a main branch 36 having an impedance which, in a preferred embodiment of the invention, includes a resistor 38 and an inductor 40 connected in parallel between the nodes 32 and 34. As is well known with respect to the electrical characteristics of either of the diodes 26 and 28, relatively little current flows in the forward direction with increasing forward voltage across the diode until the magnitude of the forward voltage reaches the breakpoint, whereupon the forward impedance drops precipitously and a relatively large current is able to flow. The magnitude of the breakpoint voltage varies in accordance with the type of construction of the diode and, in the case of a gallium arsenide diode by way of example, is typically 0.7 volts. Therefore, for relatively low amplitude of the input signal of the source 22, the input signal being indicated graphically at 42, the switching unit 30 is essentially an open circuit. However, for larger values of the input signal 42, the breakpoint voltage is exceeded, and the switching unit 30 allows current to bypass the main branch 36.

In the preferred embodiment of the invention, the source 22, the attenuator 14 and the adjustable gain amplifier 18 are operative for conducting signals along a transmission line having a characteristic impedance of preferably 50 ohms. In the linearizer 10, the 50 ohm characteristic impedance is indicated at the node 32 by a resistor 44, and at the node 34 by a resistor 46.

Figure 2:
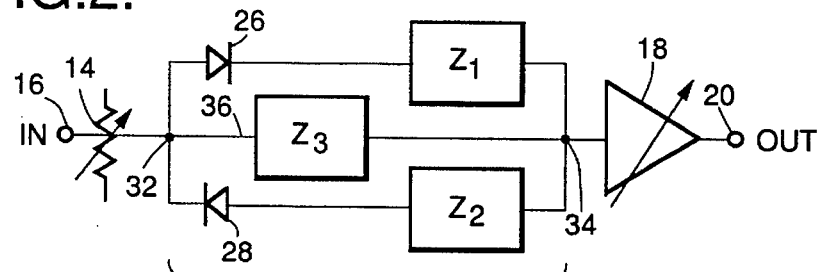
FIG. 2 show a generalized diagram of the predistortion linearizer of FIG. 1.

FIG. 2 shows a generalized schematic of the linearizer 10 wherein the diodes 26 and 28 are shown as separate branches of the circuit, and wherein each branch has some form of impedance. The impedances of the three branches are indicated by $Z_1$, $Z_2$, and $Z_3$, wherein the diode 26 is in series with the impedance $Z_1$, the main branch 36 has the impedance $Z_3$, and the diode 28 is in series with the impedance $Z_2$. In the case of the circuit of FIG. 1, $Z_1$ and $Z_2$ are simply short circuits, and $Z_3$ is the parallel combination of the resistor 38 and the inductor 40. However, in the general case, one or more of the impedances $Z_1$, $Z_2$, and $Z_3$ may have nonzero values, and any one of the impedances may comprised a resistor, of a resistor in parallel with a capacitor or inductor, or a resistor in series with a capacitor or an inductor, or even a more complex circuit arrangement such as an inductor in series with the parallel combination a resistor and capacitor, by way of example.

Figure 3:
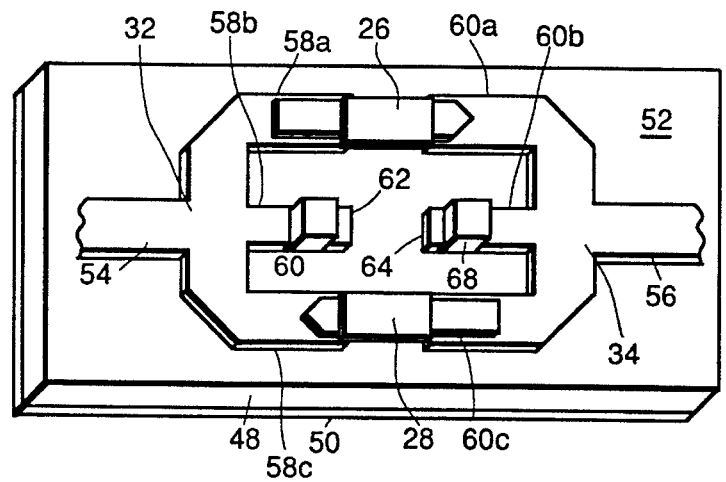
FIG. 3 is a stylized perspective view of a microstrip embodiment of the predistortion linearizer of the invention viewed from the top, the embodiment being in the form of a microwave integrated circuit.

FIG. 3 shows a construction of the nonlinear section 12 of FIG. 2 in microwave microstrip form wherein $Z_1$ and $Z_2$ are zero (short circuit), and wherein $Z_3$ is a series combination of resistance and capacitance. The circuit is formed by a substrate 48 of electrically insulating dielectric material such as a ten mil thick layer of alumina, a metallic sheet serving as a ground plane 50 on a bottom side of the substrate 48, and an array of microstrip conductors on a top face 52 of the substrate 48. The array of microstrip conductors .includes a first leg 54 and a second leg 56 connecting respectively with the nodes 32 and 34. The microstrip conductors and the ground plane may be formed of a metal such as copper or aluminum, by way of example. At the node 32, the leg 54 branches out into three branches 58A, 58B and 58C. At the node 34, the leg 56 branches out into three branches 60A, 60B and 60C. The diode 26 connects between spaced-apart ends of the branches 58A and 60A, the diode 28 connects between spaced-apart ends of the branches 58C and 60C, and a gap 62 between the facing ends of the branches 58B and 60B provides for a capacitor 64. Also included in the branches 58B and 60B are film resistors 66 and 68 connected in series with the capacitor 64. The film resistors 66 and 68 may be fabricated of tantalum nitride, and may each have a value of 100 ohms. The capacitor 64 may have a value of a few picofarads. Actual values of the resistive and the reactive elements may be found in accordance with the inventive procedure, as will be described hereinafter.

It is noted that diodes, such as the diodes 26 and 28 have capacitance which provides for coupling of high frequency signals, such as the signal 42 of the source 22, between the nodes 32 and 34. Such capacitance tends to reduce the bandwidth of the linearizer 10, and may have to be tuned out by addition of a series inductor (not shown) within each of the impedances $Z_1$ and $Z_2$. For maximum bandwidth of the linearizer 10 it is preferred to use diodes such as Schottky diodes having relatively little capacitance, GaAs Schottky barrier diodes type HP 9101 produced by Hewlett Packard being employed in a preferred embodiment of the invention.

With respect to the use of the invention, it is noted that high power amplifiers, such as the amplifier 24, have output power versus input power transfer characteristics which have linear gain when operated at low power levels. This is referred to as linear or small signal operation. As the input power to the amplifier increases, the output power behaves nonlinearly and does not increase at the same rate as the input power. As the input power increases, the output power eventually limits at the amplifier's saturated output power. This decrease in gain as the input power is increased is referred to as gain compression. As the input power to the amplifier is increased, not only does the gain experience nonlinearities, but also the phase shift through the amplifier undergoes nonlinearities. Depending on the design of the amplifier, the phase shift can either increase or decrease as the amplifier is driven into gain compression.

In the operation of the invention, the diodes 26 an 28 act as a dynamic switch changing from a high impedance to a low impedance as the drive level is increased. The linearizer 10 provides for a gain expansion which complements the gain compression of the power amplifier 24 to result in a linear amplification of the input signal of the source 22. The linearizer 10 also provides for a phase shift which complements the phase shift introduced by the power amplifier 24 so as to null out the phase shift introduce by the power amplifier 24. By way of a simple example, the power amplifier 24 and the adjustable amplifier 18 may have a combined voltage gain of 10. Maximum desired output voltage is 9 volts. Linear amplification is obtained up to 7 volts which is ten times the breakpoint voltage of 0.7 volts. If the power amplifier 24 were linear, it would be necessary to output only 0.9 volts from the nonlinear section 12 to obtain the desired 9 volts from the power amplifier 24. However, due to saturation of the power amplifier 24, it is necessary to output 1.0 volts from the nonlinear section 12 to obtain the desired 9 volt output from the power amplifier. The impedance values of $Z_1$, $Z_2$ and $Z_3$ are set to provide a gain expansion above the breakpoint voltage of 0.1 volt to raise the output voltage from 0.9 volts to 1.0 volts from the nonlinear section 12. In a similar fashion, values of capacitance and/or inductance are chosen to introduce a change in phase shift which occurs for input signal voltages, at the input node 32, which exceed the breakpoint voltage, thereby to introduce an increment or a decrement in phase shift which nulls such phase shift introduced by the power amplifier 24 upon approach to saturation.

Figure 4:
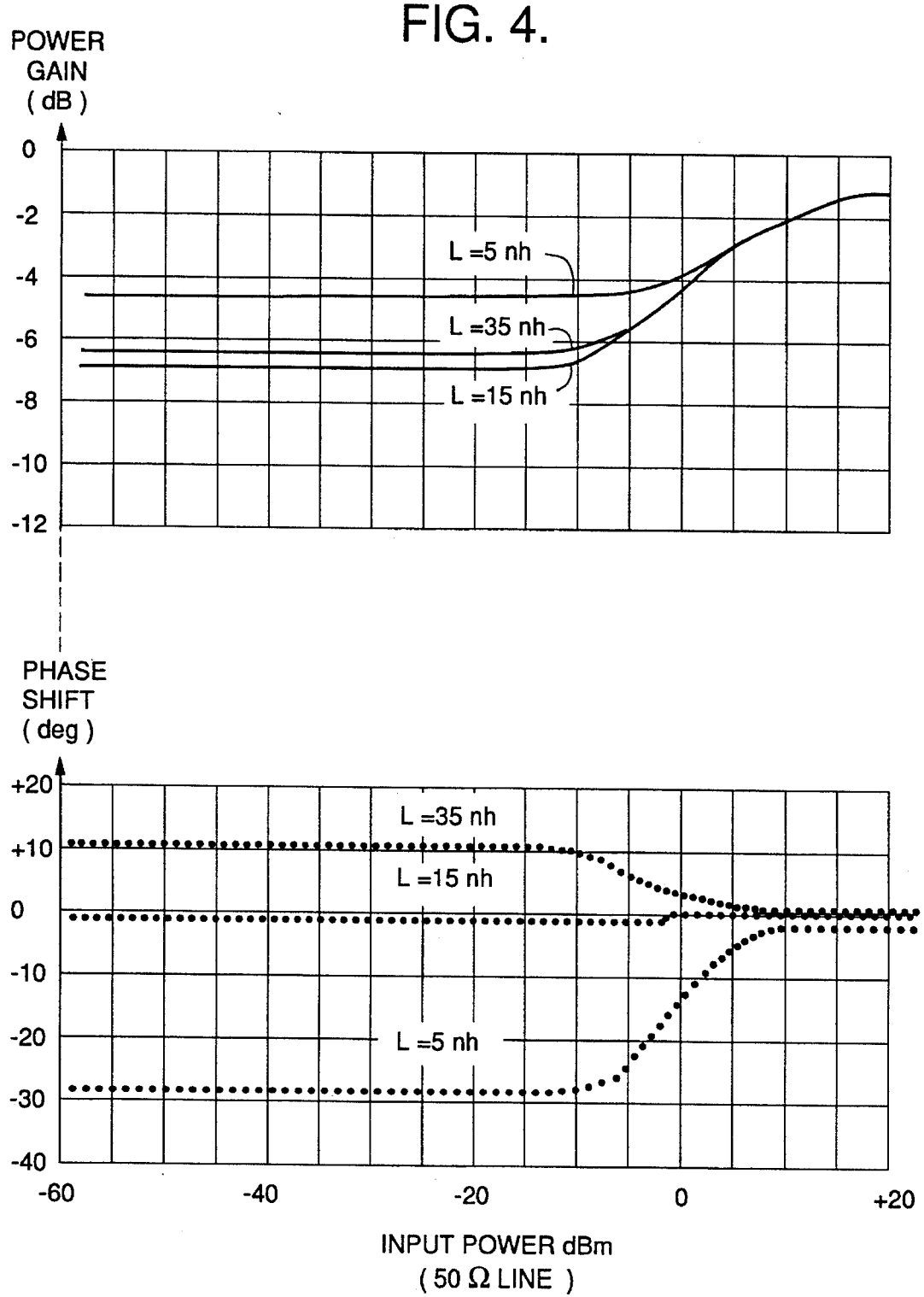
FIG. 4 is a graph showing amplitude and phase characteristics of the predistortion linearizer which are varied by selection of component values.

FIGS. 1 and 4 provide an example in the selection of the requisite impedance. In the case where the resistor 38 has a resistance of 250- ohms, the graph of FIG. 4 shows the power gain in decibels (vertical scale at the top portion of the graph) and the phase shift in degrees (vertical scale at the bottom portion of the graph) outputted by the nonlinear section 12 of the linearizer 10 as a function of input power in decibels relative to a milliwatt (horizontal scale of the graph) inputted to the node 32. The power gain and the phase shift presented by the graph is portrayed as a function of the inductance of the inductor 40 in nanohenries (nh). The results for three values of inductance are shown, namely, 5 nh, 35 nh, and 15 nh. The graphs show that for input power below −10 dBm, the output power and the output phase shift are constant and independent of input power, however, the power gain and the phase shift vary with inductance. For higher values of input power, the gain rises and tends to level off at approximately −1 dB at an input power of +20 dBm for all three values of inductance. With respect to the phase shift, both positive and negative values of phase shift are obtained, however, for increasing values of input power above −10 dBm, the phase shift decreases and tends to level off at approximately zero degrees for all three values of the inductance.

The graph shows the situation for the case wherein $Z_1$ and $Z_2$ are zero. However, by way of example in altering the shape of the gain traces of the graph, the gain expansion can be reduced by constructing $Z_1$ as a resistor in series with the diode 26, and by constructing $Z_2$ as a resistor in series with the diode 28. Further adjustment is accomplished by use of the attenuator 14 to establish the amplitude level of the input signal 42 which is to correspond to the breakpoint voltage of the diodes 26 and 28. The adjustable amplifier 18 may have an adjustment range of, for example, −6 dB to +6 dB, and serves to scale the voltage outputted by the nonlinear section 12 to match the input voltage range of the power amplifier 24. In order to demonstrate the use of the linearizer 10, the input voltage 42 is portrayed with an amplitude envelope that rises linearly with time, then is constant with time, and falls off linearly with time. This may be characterized as a rising ramp, a constant region, and falling ramp. The same shape of amplitude envelope with linear ramps, free of gain compression, is a shown at 70 for the output signal of the power amplifier 24. Also, the phase shift is constant in the output signal 70 and is free of deviation due to nonlinearities in the power amplifier 24.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. In a circuit connectable to an input terminal of a power amplifier for linearizing the power amplifier by simultaneous linearization of amplification and phase characteristics of the power amplifier, the circuit comprising:

an input terminal, an output terminal, and a set of three parallel branches interconnecting said input and said output terminals;

wherein a first of said branches has a first diode directed in a forward direction, a second of said branches has a second diode directed in a reverse direction, and a third of said branches has a third-branch impedance unit comprising both a resistive component and a reactive component;

a segment of transmission line with resistive characteristic impedance between respective ones of said terminals and ground; and said first branch and said second branch and said third branch are operative upon an input signal at said input terminal to provide said input signal with an amplification versus amplitude characteristic and a phase versus amplitude characteristic which are complementary to the amplification and the phase characteristics of said power amplifier.

2. A circuit according to claim 1 wherein said reactive component is inductive.

3. A circuit according to claim 1 wherein said resistive component and said reactive component are in parallel.

4. A circuit according to claim 1 wherein said reactive component is capacitive.

5. A circuit according to claim 1 wherein said reactive component includes both inductive and capacitive elements.

6. A circuit according to claim 1 further comprising a first-branch impedance unit disposed in said first branch in series with said first diode.

7. A circuit according to claim 6 further comprising a second-branch impedance unit disposed in said second branch in series with said second diode.

8. A circuit according to claim 1 further comprising means at said input terminal for adjusting an amplitude of an input signal incident upon said input terminal.

9. A circuit according to claim 8 further comprising means at said output terminal for adjusting an amplitude of an output signal outputted by said output terminal;

wherein said input signal amplitude and said output signal amplitude and said third-branch impedance unit are adjusted to introduce said complementary characteristics of amplification and phase to said output signal as a function of amplitude of said output signal for linearizing said power amplifier.

10. A predistortion linearizer circuit comprising:

an insulating layer of dielectric material, the layer having a top side and a bottom side;

a ground plane layer disposed on said back side of said insulating layer;

microstrip circuitry disposed on said top side of said insulating layer, said microstrip circuitry having an input terminal and an output terminal, said microstrip circuitry including a main branch and a switching branch connected in parallel between said input terminal and said output terminal;

wherein said main branch comprises a main-branch impedance unit having a reactive component and a resistive component, and said switching branch comprises a pair of antiparallel diodes; and each of said input and said output terminals constitute a segment of transmission line with resistive characteristic impedance between respective ones of said terminals and said ground plane layer.

11. A circuit according to claim 10 wherein said resistive component and said reactive component are in series.

12. A circuit according to claim 10 wherein said reactive component is capacitive.

13. A circuit according to claim 10 operative in a frequency range of approximately 2–18 gigahertz, said output terminal serving to drive a power amplifier upon connection of the power amplifier to said output terminal;

wherein an input signal amplitude and an output signal amplitude and said main-branch impedance unit are adjusted to introduce relationships of amplitude and phase to said output signal as a function of amplitude of said input signal which are complementary to amplitude and phase characteristics of said power amplifier for linearizing said power amplifier.

14. A method of distorting an AC input signal to a power amplifier characterized by a nonlinear amplitude and a nonlinear phase characteristic wherein the power amplifier provides a substantially linear amplification to the input signal for relatively small values of the input signal and wherein the power amplifier introduces a gain reduction and a phase shift to the input signal for relatively large values of the input signal resulting in an outputting by the power amplifier of a distorted replica of the input signal, the method providing a distortion of the input signal complementary to distortion by the power amplifier to linearize operation of the power amplifier, the method comprising steps of:

provifing a switching circuit having an input terminal and an output terminal and a pair of antiparallel diodes connected between the input terminal and the output terminal of said switching circuit;

connecting an impedance circuit between said input terminal and said output terminal of said switching circuit, said impedance circuit comprising solely passive electrical elements;

terminating each of said input and said output terminals with the characteristic impedance of a transmission line, said impedance being resistive;

applying an input signal to said input terminal of said switching circuit;

selecting a value of an impedance element of said impedance circuit to introduce a distortion to said input signal as a function of amplitude of said input signal; and outputting a distorted input signal to said power amplifier wherein a distortion of said input signal is complementary to the distortion of said replica, thereby to linearize said power amplifier.

* * * * *